United States Patent [19]

Bond et al.

[11] Patent Number: 5,034,742

[45] Date of Patent: Jul. 23, 1991

[54] MESSAGE COMPRESSION ENCODER AND ENCODING METHOD FOR A COMMUNICATION CHANNEL

[75] Inventors: James W. Bond; Paul A. Singer, both of San Diego, Calif.

[73] Assignee: The United States of America as represented by the Secretary of the Navy, Washington, D.C.

[21] Appl. No.: 541,115

[22] Filed: Jun. 19, 1990

[51] Int. Cl.$^5$ .............................................. H03M 7/40
[52] U.S. Cl. ..................................... 341/67; 341/106
[58] Field of Search ..................... 341/65, 67, 90, 106, 341/107

[56] References Cited

U.S. PATENT DOCUMENTS

| | | | |
|---|---|---|---|
| 3,883,847 | 5/1975 | Frank | 341/106 |
| 4,494,150 | 1/1985 | Brickman et al. | 358/261.1 |
| 4,573,034 | 2/1986 | Schouhamer Immink | 341/106 |
| 4,574,382 | 3/1986 | Ko | 341/67 |
| 4,616,211 | 10/1986 | Ross et al. | 341/67 |
| 4,624,009 | 11/1986 | Glenn et al. | 381/43 |
| 4,626,829 | 12/1986 | Hauck | 341/106 |
| 4,647,908 | 3/1987 | Ross et al. | 341/67 |
| 4,706,265 | 11/1987 | Furukawa | 341/95 |
| 4,748,638 | 5/1988 | Friedman et al. | 341/50 |
| 4,755,994 | 7/1988 | Staples et al. | 370/118 |
| 4,899,149 | 2/1990 | Kahan | 341/67 |

Primary Examiner—A. D. Pellinen
Assistant Examiner—Marc S. Hoff
Attorney, Agent, or Firm—Harvey Fendelman; Thomas Glenn Keough

[57] ABSTRACT

A message compression encoder for a communication channel carrying messages constructed of characters from a predetermined character set includes a read-only memory (ROM) and input and output temporary storage buffers respectively connected to input address ports and output data ports of the memory. The ROM has storage locations storing comma-free code words representing characters of the character set in accordance with predetermined probabilities of occurrence in messages carried by the communication channel. The input buffer receives fixed-length code words representing characters of messages carried by the communication channel and arranges them to generate addresses of the ROM storage locations for addressing the same. The ROM is operable in response to addressing of its storage locations to output stored fixed-length comma-free code words. These stored code words contain variable-length code words representing the same characters represented by the fixed-length code words but are composed of fewer bits than compose the fixed-length code words. The output buffer receives the stored code words from the ROM and a detector connected to the output buffer separates and outputs the variable-length code words. The ROM also is operable upon addressing of a predetermined code word stored therein of outputting such code word to the input buffer to cause resetting of the buffer.

21 Claims, 5 Drawing Sheets

MESSAGE COMPRESSION ENCODER AND ENCODING METHOD FOR A COMMUNICATION CHANNEL

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

Reference is hereby made to the following copending application dealing with related subject matter and assigned to the assignee of the present invention: "Message Expansion Decoder And Decoding Method For A Communication Channel" by James W. Bond et al, assigned U.S. Ser. No. 07/540,024 and filed June 18, 1990, , hereby incorporated by reference in its entirety.

BACKGROUND OF THE INVENTION

The present invention generally relates to message communication channels and, more particularly, to a message compression encoder and encoding method designed to increase the throughput of a message communication channel.

Existing communication channels, both military and commercial, are typically used to full capacity. To increase the volume of messages carried by these communication channels, it would be highly desirable to increase their throughput. One way to accomplish increased throughput is to reduce the number of bits needed to encode the messages by use of a message compression code technique.

Message compression code techniques have been used successfully heretofore to accomplish increased message throughput in communication channels that are noise-free. Noise-free channels are ones with noise levels so low that the received communication signal can be processed to recover the originally transmitted binary sequence without errors.

However, conventional message compression code techniques which have been successfully applied to noise-free communication channels cannot be applied problem-free to noisy communication channels. One major problem that has prevented their use in noisy channels is that a one-bit error in a reconstructed binary sequence can lead to many successive variable length code words being misidentified and therefore decoded in error.

SUMMARY OF THE INVENTION

The present invention relates to a message compression encoder which, when used in conjunction with a message expansion decoder comprising the invention of the application cross-referenced above, solves the above-mentioned major problem and allows use of efficient data compression codes in noisy communication channels. The message compression encoder and message expansion decoder solve the major problem experienced heretofore by combining in a novel way a modeling process (implicit in adaptive arithmetic coding) previously used adaptively for computer storage and retrieval of long narrative files, and an encoding process (known as comma-free encoding) designed to limit the impact of binary errors. The modeling and encoding processes used in the encoder and decoder are implemented in read-only memory rather than in software.

Additional novel features are involved in the selection and assignment of the comma-free code words to the fixed-length code words so as to usually limit the propagation of decoding errors to individual words of the encoded message. This is accomplished by forcing periodic reinitialization of the encoding process.

Further, the message compression encoder of the present invention is designed to accept a sequence of characters represented by fixed length code words (which are binary code words representing characters) and to output a binary sequence of concatenated variable length code words representing the same characters. The binary sequence of output bits is obtained from the input sequence of binary bits by use of read-only memory. The read-only memory is arranged such that the binary code words stored in it, which represent the characters of sets from which messages carried by the communication channel are constructed, are addressed using triples of input code words to the encoder and are stored in the memory locations in accordance with predetermined unconditional and conditional probabilities of occurrence of the characters in the messages. Also, the average number of bits per code word assigned by the read-only memory is about one-half of the number of information carrying bits of fixed length input code words.

The message expansion decoder of the cross-referenced invention is designed to accept the message compression encoder output (a binary sequence of undifferentiated variable length code words) and reconstruct the sequence of fixed-length code words which would have been input to the encoder to produce the received binary sequence. The decoder first determines the individual binary code words which have been assigned to the fixed-length code words by the encoder and then recovers the original fixed-length code words through use of read-only memory designed to invert the encoding process.

In summary, the message compression encoder of this invention and the message expansion decoder of the cross-referenced invention when used in conjunction with one another are designed to increase message throughput of military and commercial communication channels by replacing an inefficient character code utilizing code words containing equal numbers of bits with a more efficient character code utilizing code words of variable length.

OBJECTS OF THE INVENTION

Accordingly, it is the primary object of the present invention to disclose a message compression encoder which provides increased message throughput in military and commercial communication channels by reducing the number of bits required to encode the messages.

Another object of the present invention is to disclose a message compression encoder which accepts a sequence of characters represented by fixed length code words and outputs a binary sequence of concatenated variable length code words representing the same characters.

Still another object of the present invention is to disclose a message compression encoder which obtains the binary sequence of output bits from the input sequence of binary bits by use of read-only memory.

Other objects, advantages and novel features of the invention will become apparent from the following detailed description of the invention when considered in conjunction with the accompanying drawings.

DETAILED DESCRIPTION OF THE INVENTION

Overview

Figure 1:
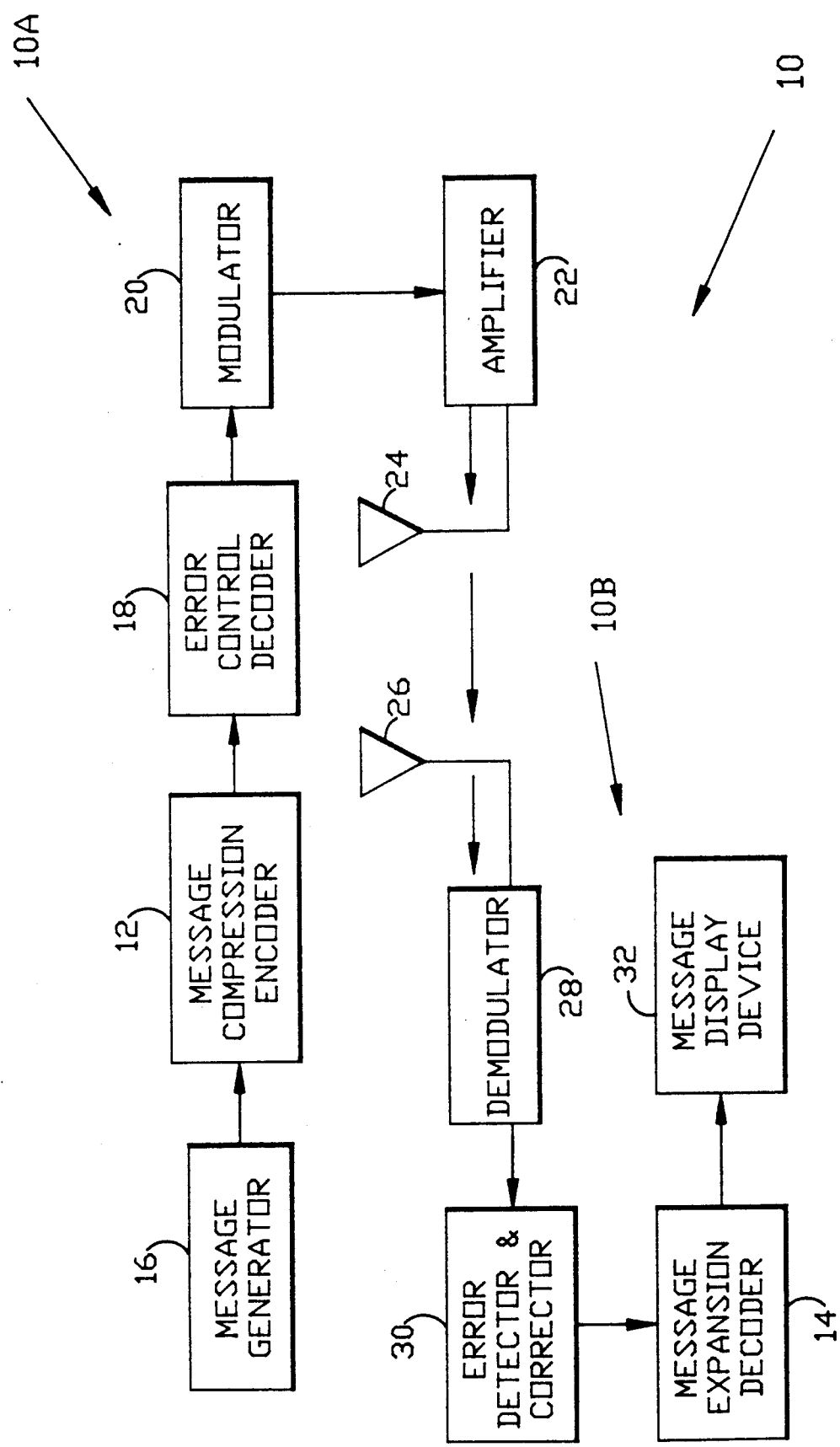
FIG. 1 is a schematic diagram of a communication channel containing a message compression encoder in accordance with the present invention and a message expansion decoder in accordance with the cross-referenced invention.

Referring now to the drawings, and particularly to FIG. 1, there is shown, in general schematic form, a typical military communication channel 10 having message transmitting and receiving portions 10A and 10B. Transmitting and receiving portions 10A and 10B of communication channel 10 respectively incorporate message compression encoder 12 of the present invention and message expansion decoder 14 of the cross-referenced invention along with other conventional hardware/firmware components of the channel 10. In particular, the conventional components of transmitting portion 10A of channel 10 includes message generator 16 connected to and located upstream of encoder 12, and error control decoder 18, modulator 20, amplifier 22, and transmitter antenna 24 in a serial arrangement connected to and located downstream of encoder 16. Receiving portion 10B of channel 10 includes receiver antenna 26, demodulator 28, and error detector and corrector 30 in a serial arrangement connected to and located upsteam of decoder 18 and message display 32 connected to and located downstream of decoder 18.

Figure 2:
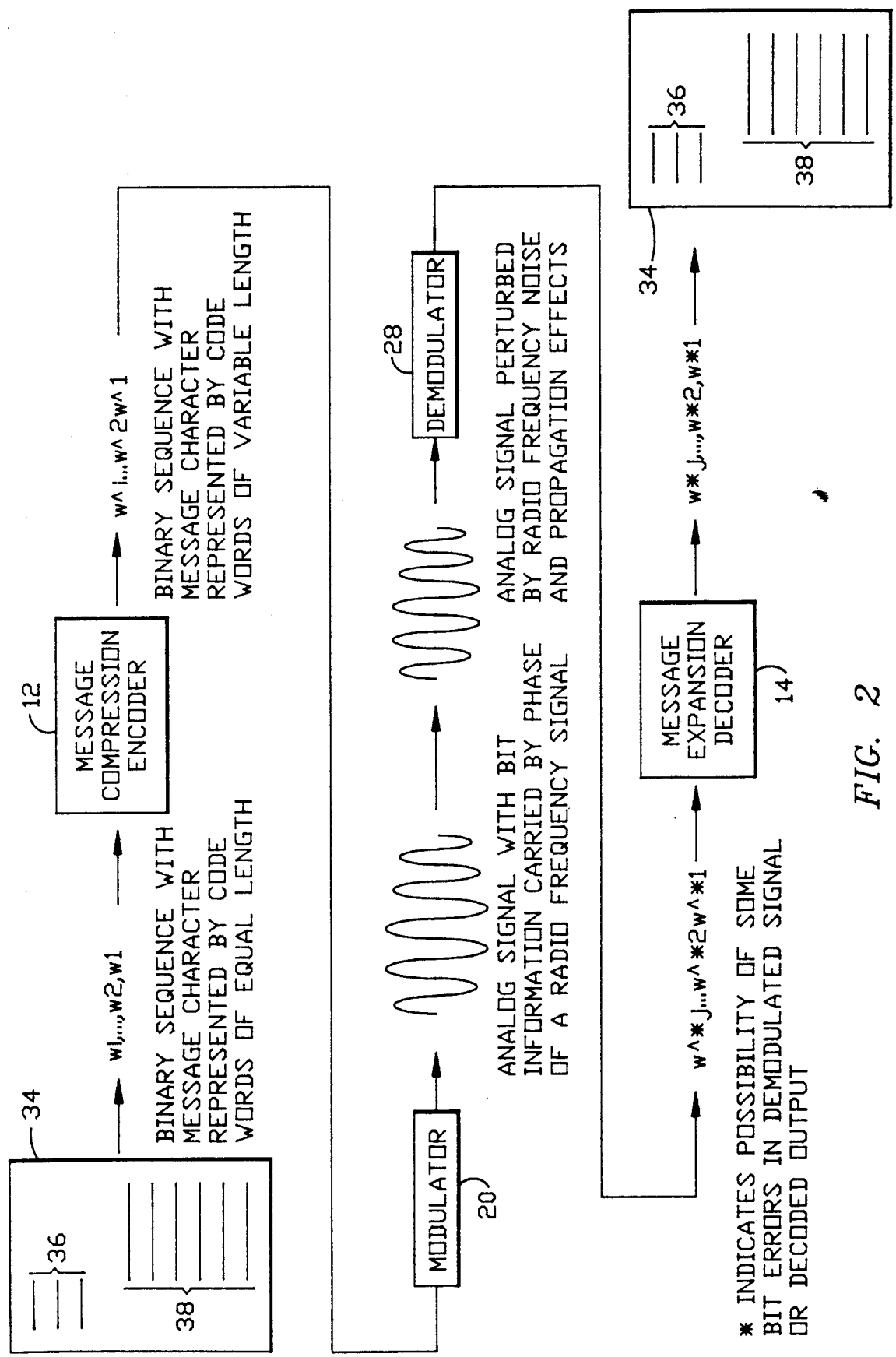
FIG. 2 is a schematic diagram of the communication signal structure throughout the communication channel of FIG. 1.

FIG. 2 is a schematic diagram of the communication signal structure throughout military communication channel 10 of FIG. 1. The message represented by block 34 in FIG. 2 is composed of header and narrative portions represented by sets of lines 36 and 38. Message compression encoder 12 and message expansion decoder 14 process both header and narrative portions 36 and 38 of message 34, although the processing is so structured that most of the performance gain will be obtained through encoding and decoding of narrative portion 38 of message 34.

Referring to FIGS. 1 and 2, message 34 inputted from message generator 16 to message compression encoder 12 of the present invention is composed of a binary sequence which includes identifiable words (m-bit words encoding an N character alphabet) representing the characters of message 34 (header and narrative portions 36 and 38). The individual words inputted to encoder 12 from message generator 16 are fixed-length binary code words represented by w1, w2, . . . , wi.

Message compression encoder 12 of the present invention transforms fixed-length binary code words w1, w2, . . . , wi from message generator 16 into respective variable-length code words w 1, w 2, . . . , w i. The output of encoder 12 is represented by the sequence of concatenated variable-length code words w i . . . w 2w 1.

The output of encoder 12 may or may not be inputted to other digital components, e.g., error control encoders and crypto encoders, designed to overlay error detection and correction coding and encryption, respectively, over the compression coding provided by encoder 12. Error control decoder 18 is shown in FIG. 1 connected to the output of encoder 12 to illustrate overlaying of additional coding over the message compression coding provided by encoder 12. Error detector and corrector 30 is shown in FIG. 1 connected to the input of decoder 14 to illustrate reversal of the overlaying of additional coding over the message compression coding provided by encoder 12 before input thereof to decoder 14.

However, neither encryption coding nor error detection and correction coding is shown in FIG. 2. It is not necessary to describe herein the processing steps performed by either component 18 or 30 because such processing steps are not part of the present invention and the message compression coding provided by encoder 12 of the present invention works well whether or not the overlaying of additional coding is present. Also, since the processing steps are applied to the output of encoder 12 and then reversed before the received signal is inputted to decoder 14, the respective operations of encoder 12 and decoder 14 are relatively unaffected by such processing steps making an explanation of them unnecessary for understanding the present invention and the cross-referenced invention. Further, the notation for the signals produced by such processing steps need not be introduced in order to describe the operation of encoder 12 and decoder 14. The notation as represented in FIG. 2 will be the basis used hereinafter for describing the operations of encoder 12 and decoder 14.

Continuing in reference to FIGS. 1 and 2, modulator 20 of transmitting portion 10A of communication channel 10 transforms the sequence of concatenated variable-length code words represented by w i . . . w 2w 1 from encoder 12 into an output analog time-varying radio frequency signal. The information contained in the bits of the input sequence to the modulator 20 is carried by the phase of the analog time-varying output signal. The modulator output signal is amplified by amplifier 22 and broadcasted through air at transmitter antenna 24 and received at receiver antenna 26 along with environmental and man-made radio frequency noise and interference.

Demodulator 28 of receiving portion 10B of channel 10 processes the received signal and outputs a sequence of concatenated variable-length code words w *1w *2 . . . w *j that provides the input to message expansion decoder 14 of the cross-referenced invention. Decoder 14 transforms the sequence of concatenated variable-length code words back into respective fixed-length code words w*1, w*2, . . . , w*]. The output of decoder 14 is inputted to message display 32. (The "*"s are used in the representations of the code words to allow for the possibility of bit errors introduced into the received signal due to transmission through a noisy channel.)

Properties of Code Words

The principle of operation of message compression encoder 12 of the present invention, and ultimately also of message expansion decoder 14 of the cross-referenced invention, depends on certain properties of input equal-length code words wi and output variable-length code words w̄ i of encoder 12. The properties of these code words will be described before a detailed description of message compression encoder 12 of the present invention is presented.

The input sequence of equal-length code words wi must possess two properties for encoder 12 and decoder 14 to operate as desired. The first property referred to as the "structured word property" is as follows: the input sequence must be composed of identifiable equal bit length code words that represent the characters to be encoded. The second property referred to as the "correspondence property" is as follows: there must be a one-to-one (or possibly a one-to-many) correspondence between characters in the message and the equal-length code words used to represent the characters so that decoding of the encoding sequence is possible. These are very weak conditions to meet and are typical properties of the outputs derived from all conventional practical message generators.

The variable-length code words w̄ i assigned to the equal-length code words wi must also have two properties for encoder 12 and decoder 14 to operate as desired. The first property referred to as the "comma-free property" is as follows: it must be possible to identify the individual code words from the sequence of binary bits obtained by concatenating successive code words. The second property referred to as the "zero-extension property" is as follows: it must be possible to unambiguously recover a code word from any binary word obtained from it by adding an arbitrary number of zeros to the end of the code word.

Encoder 12 and decoder 14 operate as intended in the presence of bit errors because of the above specified special properties of comma-free binary codes. Preferably, a particular comma-free binary code is used. It is one of a family of "suffix/prefix" codes, described by R. A. Scholtz in "Maximal And Variable Word Length Comma-Free Codes", IEEE Transactions on Information Theory, Vol. IT, No., March 1969. However, the selected comma-free code is used by encoder 12 herein in a different way than envisioned by R. A. Sholtz in his cited publication.

The comma-free binary code words used herein are of the form: k "0"s followed by h "1"s with k>0, h>0, and k+h<or=M, where M is the maximum length of a binary code word needed to encode the different characters of the messages. Note that this code has the "comma-free property" and "zero-extension property" specified above.

For example, given binary code words 01, 001111, 0000011, ..., the concatenated binary sequence would be 10011110000011... Given this binary sequence, the binary code words can be recovered by interjecting commas after the last of a sequence of "1"s so that for the above sequence this rule would lead to 01,001111,0000011,... However, even if the beginning and ending of the sequence are unknown, all but the end words can be identified. To illustrate this, suppose that the initial and final bits were not in the concatenated sequence supplied to decoder 14, i.e., that the output of demodulator 28 to decoder 14 were 1001111000001. Then the above rule would lead to 1,001111,000001 with the first word known to be incomplete and doubt about the last word (in this example it is also incomplete).

The above described code also has the zero-extension property. Given a code word of the form 0...01...1, any zero-extension also has the form 0...01...1 with or without a fixed number of zeros adjoined after the "1"s. Clearly these can be identified and stripped to identify the original code word.

It should be noted that there are n−1 code words of length n in the comma-free code chosen for use herein, for n=2, 3, ... The comma-free code has the following code words arranged by increasing length:

```
01
001 011
0001 0011 0111
00001 00011 00111 01111
000001 000011 000111 001111 011111
0000001 0000011 0000111 0001111 0011111 0111111
 .
 .
 .
```

It is easy to determine the maximum length, M, of the code words needed for a particular application. If the maximum number of characters to be decoded is N, then M is the smallest integer that will satisfy the inequality:

$$2+3+...M-1 = (M+1)(M-2)/2 > \text{or} = N.$$

For example, if N=56 (which is the number of distinct characters in the Baudot character set used by the Department of the Navy), for M=11 (or a maximum word length of 11 bits) there would be only 54 code words available. Thus, a maximum word length of 11 is too short. For M=12, there would be 65 code words available which is more than the 56 required. Thus, the smallest M or maximum word length satisfying the above inequality is 12 bits.

The comma-free code chosen for employment with encoder 12 and decoder 14 has sufficient numbers of short code words so that its use can result in significant message compression. By this is meant that the encoded binary sequence generated by encoder 12 will contain significantly fewer (about half as many) bits than the input sequence to the encoder.

Message Compression Encoder of Present Invention

Figure 3:
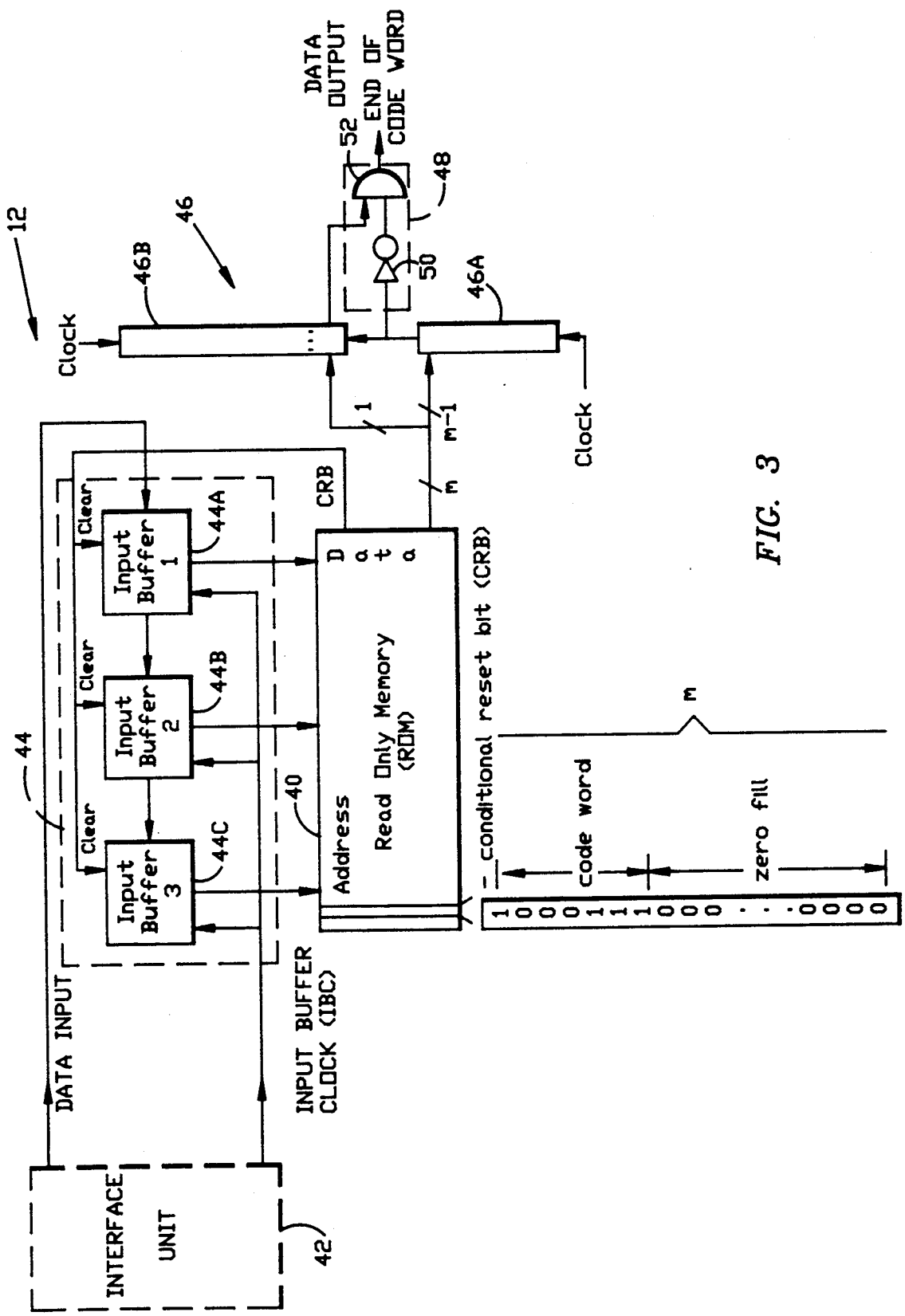
FIG. 3 is a detailed schematic diagram of the message compression encoder of the present invention.

Referring to FIG. 3, the message compression encoder 12 of the present invention is constructed of standard digital hardware and read-only memory (ROM) 40 designed to accept a sequence of characters represented by fixed-length code words (which are binary code words representing characters) and output a binary sequence of concatenated variable-length code words representing the same characters. As described above, the fixed-length code words inputted to encoder 12 are represented by w1, w2, ..., wi. The fixed-length code words are transformed by encoder 12 into respective variable-length code words w̄ 1, w̄ 2, ..., w̄ i and outputted as the binary sequence of concatenated variable-length code words, w̄ i ... w̄ 2w̄ 1.

As will be described in detail below, the binary sequence of output bits, composing the variable-length code words, is obtained from the input sequence of binary bits, composing the fixed-length code words, by use of read-only memory (ROM) 40 of encoder 12. ROM 40 is constructed such that the binary code words stored in it are addressed using triples of the binary code words being inputted to encoder 12. The average number of bits per code word assigned by ROM 40 is estimated to be about half the number of information carrying bits of the fixed length input code words so that encoder 12, when used with decoder 14, would provide significant improvement in the throughput of communication channel 10.

FIG. 3 is a detailed schematic diagram of an exemplary embodiment of digital components which comprise encoder 12 and implement the central processing accomplished by the encoder. A conventional interface unit 42 is also shown in FIG. 3, being illustrated in dashed outline form to indicate that its specific design is not part of the encoder 12 of the present invention. It is not part of encoder 12 because its design depends on the design of message generator 16. Given the design of encoder 12 disclosed herein and the design of a conventional message generator, it is within the capability of one of ordinary skill in the art to design an appropriate interface unit 42 without undue experimentation being required. Interface unit 42 would consist of a buffer to accept message generator output digital words representing message characters and to accept an input from the output of encoder 12 which would initiate input of a fixed-length code word to encoder 12 in either serial or parallel form. The clock signals used to control the timing of encoder 12 would also be provided by interface unit 42. Interface unit 42 thus buffers the synchronous output of message generator 16 with the asynchronous input requirements of encoder 12.

In addition to ROM 40, the encoder 12 includes input shift register 44 and output register 46. Input shift register 44 is composed of first, second and third input buffers 44A, 44B and 44C which can be implemented by components available from supplier, Texas Instruments of Dallas, Texas, and identified by Type Number TI74164, which are serial-in and parallel-out (SIPO) registers. Output register 46 is composed of first and second output buffers 46A and 46B which can be implemented by components also available from supplier, Texas Instruments of Dallas, Texas, and identified by Type Number TI74165, which are parallel-in and serial-out (PISO) registers. ROM 40 can be implemented by a component available from supplier, Signetics Corporation of Sunnyvale, California, and identified by Type Number 2732. Encoder 12 also has detector 48 which includes inverter 50 and AND gate 52 connected to output register 46. Specifically, inverter 50 is connected to the serial output of first output buffer 46A, whereas AND gate 52 is connected to the output of inverter 50 and the output of the single stage of second output buffer 46B. Inverter 50 and AND gate 52 can be implemented by respective components available from supplier, Texas Instruments of Dallas, Texas, and identified by Type Numbers SN7407 and SN7411.

There are two inputs to encoder 12 from interface unit 42. The first input, designated as DATA INPUT in FIG. 3, is a serial binary sequence of fixed-length code words (wi) encoding characters of the message. The second input, designated as INPUT BUFFER CLOCK (IBC) in FIG. 3, is a binary clock signal used to control input buffers 44A, 44B and 44C of input shift register 44. There are two outputs from encoder 12. The first output, designated as DATA OUTPUT in FIG. 3, is a binary sequence of variable-length code words (w i) used to encode characters of the message. The second output, designated as END OF CODE WORD (EOC) OUTPUT in FIG. 3, is an end of code word binary signal to interface unit 42 used to initiate clocking of a new code word into encoder 12.

ROM 40, of course, contains memory or storage locations having addresses. ROM addresses are fixed-length binary sequences and its storage locations store code words of fixed-length in which are contained or embedded the variable-length code words. Each storage location must be capable of storing at least M+1 bits with M being the maximum length of a code word in the comma-free code described earlier. Each storage location contains an initial bit and a comma-free code word zero-extended to fill the memory location. The initial bit is a condition reset bit (CRB) used to reinitialize the input shift register 44, when necessary.

ROM 40 can be viewed conceptually as composed of three parts. The memory parts are distinguished from one another conceptually by the nature of the comma-free code words stored in them. The different natures of the comma-free code words will result in their having different probabilities (or frequencies) of occurrence. Based on their different natures and premised on their different probabilities of occurrence, the comma-free code words can be sorted and assigned to these three conceptually different parts of ROM 40 after performance of appropriate off-line processing using a data base of representative messages to be encoded and decoded respectively by encoder 12 and decoder 14. Such off-line processing will be described later to provide a specific example of how ROM 40 is constructed for a specific application of encoder 12 and decoder 14.

Before describing the three part of ROM 40, recall that the comma-free code words have the structure of k "0"s followed by h "1"s with k and h both positive integers. Therefore, each comma-free code word can be unambiguously recovered from any zero-extension of it. The comma-free code words stored in each part of ROM 40 are addressed by using triples of the fixed-length input code words to encoder 12.

The first part of ROM 40 stores the comma-free code words to be assigned to the message characters encoded by encoder 12 based solely on the probability of occurrence of such characters and not conditioned on receipt of previous characters by encoder 12. This first part of ROM 40 is addressed by addresses having the form (wi,0,0).

The second part of ROM 40 stores the comma-free code words to be assigned to the message characters encoded by encoder 12 based on their probability of occurrence and conditioned on the previous character inputted to encoder 12. This second part of ROM 40 is addressed by addresses having the form (w[i+1],wi,0). (Note that here, as elsewhere in the detailed description, brackets are used to enclose indices only when necessary to avoid ambiguity.)

The third part of ROM 40 stores the comma-free code words to be assigned to the message characters encoded by encoder 12 based on their probability of occurrence and conditioned on the previous two characters inputted to encoder 12. This third part of ROM 40 is addressed by addresses having the form (w[i+2],w[i+1],wi).

Input shift register 44 of encoder 12 generates the addresses of the memory locations in the three parts of ROM 40 where the comma-free codes words (with the shorter comma-free code words zero-extended to code words of the maximal length of any of the comma-free code words) to be assigned to the fixed-length input code words are stored. First, second and third input buffers 44A, 44B and 44C of input shift register 44 store the binary bits of three successive input code words so that the addresses of the memory locations of ROM 40 are of fixed length. The IBC signal controls operation of input buffers 44A, 44B and 44C in addressing ROM 40.

The principle of operation of input shift register 44 is as follows. Let (0,0,0) denote the contents of shift register 44 before being fully loaded. (It is assumed the code word of all zeros is not an allowable input to encoder 12.) Let (w3,w2,w1) denote the contents of shift register 44 after input of code word w1, followed by code word w2, followed by code word w3. Thus after loading the first input code word after resetting input shift register 44, its content is denoted by (w1,0,0); next, after the next code word is loaded its content is denoted by (w2,w1,0); finally, after the third input code word, the shift register is fully loaded and has content (w3,w2,w1).

An automatically-performed register reset operation reads the first bit of the ROM memory contents and if this bit is "1", first, second and third input buffers 44A, 44B and 44C of input shift register 44 are reset to all "0"s. On the other hand, if this bit is "0", the input buffers of the input shift register are not reset. This operation is accomplished physically by routing the initial or condition reset bit (CRB), which is the highest order output of ROM 40, to the "clear buffer inputs of first, second and third input buffers 44A, 44B and 44C. Upon receipt of a "1" as input to the "clear buffer" inputs, input shift register 44 is reset to "0"s.

The remaining m bits of ROM 40 are routed to first output buffer 46A of output register 46 which, as will now be described, serves to strip the zero-extension bits from the code word (w i) stored in ROM 40. The zero-extension or fill bits are detected through use of detector 48 in conjunction with one stage of second output buffer 46B of output register 46. When a "0" follows a "1" for the first time in a new code word, the output of AND gate 52 of detector 48 is a "1" (signifying EOC) and this "1" is used as an input to external interface unit 42 to cause another code work to be loaded in parallel from ROM 40 to first and second output buffers 46A and 46B of output register 46, with only the one lead bit of m bits going into second output buffer 46B and the remaining m−1 bits going into first output buffer 46A.

Note that the lead bit of code word m is always a "0" so that when a new word is loaded into first and second output buffers 46A and 46B, the highest order bit is a "0" and the output of AND gate 52 is then "0" whether its inverted input from inverter 50 is a "0" or a "1". Thereafter, the highest bit remaining in first output buffer 46A is inputted into the one stage of second output buffer 46B and fed to AND gate 52. AND gate 52 compares this noninverted bit from second output buffer 46 B to the following inverter bit. AND gate output remains "0" until the previous bit is a "1" and the next bit is a "0" (inverted to be a "1"). The first "0" following a string of "1"s would therefore be inverted to a "1" and the output of AND gate 52 would become a "1", thus signaling EOC and the beginning of the zero-extended portion of the code word. This "1" would cause interface unit 42 to clock in the next code word, which causes erasing or stripping of the zero-extended portion of the previous code word m from the output of encoder 12 merely due to entry of the bits of the next code word into first output buffer 46A. In such manner, only the variable-length code word portion of code word m is outputted from encoder 12.

In summary, the steps carried out by external interface unit 42 and encoder 12 together are as follows: (1) interface unit 42 clocks new code words into the input buffers of serial-in parallel-out input register 44 of encoder 12 using input buffer clock (IBC); (2) data stored at ROM memory locations identified by address bits from input shift register 44 is loaded into the parallel-out serial-in output register 46; (3) data from output register 46 is clocked out of encoder 12 until an end of code (EOC) indication appears which is at the start of a zero-extension portion of the code word; and (4) at occurrence of EOC, the steps are started over.

Design of Encoder ROM for an Exemplary Application

As was mentioned earlier, off-line processing is necessary to design the different parts of encoder ROM 40 to match a particular application and the principles upon which the design of the ROM is based. Designing the encoder ROM entails assigning stored code words w 1 to input code words w1 based on the results of the off-line processing in such a manner as to achieve significant message compression while limiting the impact of bit errors on the decoding method.

The off-line processing should use a data base of messages to be encoded by encoder 12 and decoded by decoder 14. The messages chosen for the data base should be representative of the messages to be encoded. The more representative the set of messages chosen for off-line processing, the better the compression performance provided by encoder 12.

The structure of the comma-free codes limit the impact of bit errors on the method used within decoder 14 (to identify the variable-length code words encoded by encoder 12) to the misidentification of at most two code words. However, given that an error has occurred in a code word, then it will be decoded in error, the next code word will be decoded in error if conditioned on it, the next code word decoded in error if conditioned on either of the previous code words, and so on. To prevent decoding error from propagating in this manner, it is necessary to reinitialize the code word encoder fairly often. The following explanation provides a conceptual basis for reinitializing the encoder.

Military and commercial messages are transmitted using characters of various types. For the purpose of describing the design of encoder and decoder ROMs, the characters are placed in three categories:

$C[I] = \{A,B,C,\ldots,X,Y,Z\}$
$C[II] = \{0,1,2,\ldots,9\}$
$C[III] = \{$punctuation symbols, special characters, control characters$\}$ Now, suppose that the probabilities of occurrence of the characters in the sets C[I], C[II], and C[III] have the following properties:

(1) the probability of occurrence of a character in C[I] depends on whether the previous character was a member of C[I], C[II], or C[III],
 (i) if the previous character was in C[I], then it depends on the particular member of C[I] which occurred,
 (ii) if the previous character was in C[II]or C[III], then it does not depend on the particular member of the sets which occurred;
(2) the probability of occurrence of a character in C[II] depends on whether the previous character was a member of C[I], C[II], or C[III],
 (i) if the previous character was in C[II], then it depends on the particular member of C[II] which occurred (for military messages with many latitudes and longitudes for a given operational area this will be the case; however, for non-military messages, it may not be the case), (ii) if the previous character was in C[I] or C[II], then it does not depend on the particular member of the sets which occurred;

(3) the probability of occurrence of a character in C[III] depends on whether the previous character was a member of C[I], C[II], or C[III], but not on the particular character that has occurred.

The above properties are not necessary for the encoder 12 to work. Instead, they formulate those characteristics of the English language and use of numbers in military messages that motivate the design of the ROM in the encoder. The above-supposed properties suggest the following rules should govern resetting the input shift register 44 in encoder 12 (and then by inference the decoder):

(1) if character c is in C[III], then reset the input shift register to all zeros;

(2) if character c is in either C[I] or C[II], then do not reset the input shift register.

In order to limit the propagation of decoding errors, code words are assigned to ROM addresses having the form (wi,0,0), addressing memory locations in the first part of ROM 40 as described earlier, which represent characters in character set C[III] independent of previous characters. The most frequently occurring character in any message is the blank character, which causes a space to occur in the printed manuscript. We reserve the shortest comma-free code word, namely "01" to encode the blank. (After this design decision is made, rule (1) above, governing resetting the input shift register 44, becomes more reasonable.)

The first off-line processing task is designed to determine the assignment of comma-free code words to the equal-length code words representing members of character set C[III]. This task is accomplished by first calculating the probabilities of occurrence of every character in C[I], C[II], and C[III]. The characters are then arranged in a list according to their probabilities of occurrence from the most likely to occur (the blank) to the least likely to occur. The comma-free code words are arranged in a list according to length from the shortest to the longest. The n-th comma-free code word in the list is assigned to the fixed-length code word representing the character which is n-th in the list of characters. The variable-length code words assigned to the fixed-length code words representing characters in C[III] by this process are fixed. This means that the same variable-length code word assigned to the fixed-length code word for c in C[III] is assigned to the memory locations addressed by addresses of the forms (wi,0,0), (wi,wj,0), and (wi,wj,wk) for wi representing c.

The variable-length code words assigned to fixed-length code words representing characters in C[III] are not available to be assigned to fixed-length code words representing members of C[I] and C[II]. The variable-length code words available to be assigned to the code words representing members of C[I] or C[II] will be referred to hereafter as "available" comma-free code words.

The probability of occurrence of a member of C[I] as the first letter of a word will be different than its unconditional probability of occurrence. Thus, available comma-free code words assigned to fixed-length code words representing letters in C[I] and addressed by addresses of the form (wi,0) will be based upon the probability that the character in the character set C[I] is the first letter of a word.

The probability of occurrence of a member of C[II] may be different if the number is the first number of a sequence than if it is a later number in a sequence. Thus, available comma-free words assigned to the fixed-length code words representing numbers in C[II] and addressed by addresses of the form (wi,0) will be based upon the probability that the number in the character set C[II] is the first number in a sequence of numbers.

The second off-line processing task is governed by the observations contained in the previous two paragraphs. This task should calculate the probabilities that a character occurs in C[I] or C[II] as the first letter in a word (including one letter words) or the first number in a sequence of numbers (including single numbers). The characters and letters are then listed according to these probabilities, beginning with the most frequently occurring and ending with the least frequently occurring. The available comma-free code words are listed according to length, beginning with the shortest code words and ending with the longest word. The n-th available comma-free code word is assigned to the fixed-length code word representing the n-th character in the list of letters and numbers.

The third off-line processing task calculates the probabilities of each of the following events: (a) a specific letter follows another specific letter beginning a word, (b) a specific number follows a specific letter beginning a word, (c) a specific number follows another specific number in the beginning of a sequence of numbers, and (d) a specific letter follows a specific number which was the beginning of a sequence of numbers. These calculations provide the conditional probabilities of c occurring given that d has occurred with c in C[I] or C[II] and d in C[I] as the first letter in a word or in C[II] as first number in a sequence.

After completion of the second and third off-line processing tasks, 36 lists of 36 conditional probabilities of occurrence of characters in C[I] or C[II] are constructed by use of a computer program. A list is generated for each character in C[I] or C[II] upon which the conditional probabilities are calculated. Each such list of 36 characters (26 letters and 10 numbers) is ordered according to its conditional probability of occurrence beginning with the most commonly occurring and ending with the least commonly occurring. The available comma-free words are listed according to length from the shortest to the longest. The n-th available comma-free code word is assigned to the fixed-length code word representing the n-th character in the list. These assignments determine the structure of the encoding ROM addressed by addresses of the form (wj,wi,0) for wj and wi representing characters in C[I] or C[II].

For example, the first list described in the previous paragraph could be the list of probabilities that c in C[I] or C[II] has occurred given that d has occurred starting a word. Then the c would be listed according to their probabilities of occurrence given that a word starts with d. The 36 characters are listed according to the probabilities that they occur next from the highest probability one to the lowest probability one. The available comma-free code words are listed from shortest to longest and the assignment made accordingly. This list would be the basis for determining that part of the memory storing w j encoding wj as addressed by (wj,w,0) where d is represented by w.

The fourth and fifth off-line processing steps complete the required off-line processing necessary to design the encoder ROM to handle messages in a particular communication channel most efficiently. In these steps the probabilities of a character occurring in either character set C[I] or C[II] given that a pair of characters have occurred from C[I] or a pair have occurred from C[II] are calculated. These calculations are used by a computer program to provide 26×26×36 characters, plus 10×10 lists of 36 characters. Each of these lists are the basis for assigning the available comma-free code words to the characters in the particular list conditioned on the previous occurrence of the pair of characters of the list.

If c occurs after d, and if both are not from C[I] or C[II], then the contents of the memory addressed by (wi,wj,wk) with wj representing c and wk representing d will be the same as that addressed by (wi,wj,0) already described. If c and d are both from C[I] or both from C[II], then the contents stored in the encoding ROM are based on the probabilities developed by the fourth and fifth processing steps.

Let C denote the union of C[I], C[II], and C[III]. The size of the required encoding ROM follows from the fact that the only allowable addresses are of the following:

(a) (wi,0,0), wi representing c in C
(b) (wi,wj,0), wi, wj representing c in C, d in C[I] or C[II], respectively
(c) (wi,wj,wk), wi, wj, wk representing c in C, d in C[I] or C[II], and e in C[I] or C[II], respectively. If it is assumed that N=60, then C[I] has 26 members, C[II] has 10 members, and C[III] has 24 members. It follows that there are 60 addresses of form (a) above, 60×36=2,160 addresses of form (b) above, and 60×36×36=80,760 addresses of form (c) above. The total number of different addresses is 60+2,160+80,760=82,980.

To summarize, from the above it can be readily understood that the encoder ROM uses comma-free encoding of characters based on their conditional probabilities of occurrence. This encoding method solves the major problem that has prevented compression encoding in noisy channels heretofore, namely, the problem that one bit error in the reconstructed binary sequence can lead to many successive code words being incorrectly identified and incorrectly decoded. This encoding method is a novel combination of a message modeling procedure (implicit in adaptive arithmetic coding) previously used for computer storage and retrieval of long narrative files and an encoding process (known as comma-free encoding) designed to limit the impact of binary errors on decoding. These modeling and encoding procedures are implemented by this encoding method in ROM rather than in software. By selection and assignment of the comma-free code words to the fixed-length code words and forcing periodic reinitialization of the encoding method, propagation of decoding errors can be limited to individual words of the encoded message.

Design of Encoder ROM for Alternative Application

The design of the encoder ROM described above in the one exemplary application was for specific character sets. However, any character sets C[I], C[II], and C[III] can be created, and the same rules as described above can be used to reset the registers and to calculate the required probabilities of occurrence and assign variable-length code words (as many code words as required by the size of the character set) to the characters.

As an alternative, the design of encoder 12 can be simplified by only using unconditional probabilities of occurrence and probabilities of occurrence conditioned on one previous character having occurred. The ROM only would contain two parts: (1) a first part addressed by addresses of the form (wi,0) storing the variable-length code words assigned to characters based on their overall probability of occurrence, and (2) a second part addressed by addresses of the form (w[i+1], wi) storing the variable-length code words assigned to characters conditioned on the receipt of the previous character. The same code words would be assigned to the first part of the ROM as for the specific example described above. The assignment of code words conditioned on the receipt of the previous character is different than that for the one specific application described above. The assignment is based on the probability that a character occurred given that a previous character has occurred (with the condition that the previous character be the first letter in a word or the first number in a sequence removed). The register reset rules are the same as those described above for the one specific application.

Other components of encoder 12 in FIG. 3 are also simplified. Only two input buffers in input shift register 44 are used because only pairs of input words are used to address ROM 40. The memory requirements are greatly reduced also. For instance, based on the characters sets above, only about 60+(36×60)=2220 code words would be addressable. The output buffer components remain the same and are used in the same way.

Of course, more complex realizations of the ROM encoding method of encoder 12 are possible. Instead of restricting conditional probabilities to p(b a) and p(c a,b), the encoding scheme could be based on the use of conditional probabilities p(d a,b,c), p(e a,b,c,d), etc., as well as those used in the design described earlier. The use of more and more complicated conditional probabilities leads to the requirement of larger and larger ROMs in the encoder (and a compatible decoder).

For example, if p(d a,b,c) is used as well as p(c a,b), p(b a), and p(a), then the encoder ROM would have a fourth part containing 36×36×36×60 code words. In addition, the off-line calculations would be altered so that p(c a,b) would be obtained for c given a and b had occurred as the first two letters of a word or the first two numbers of a sequence, while p(d a,b,c) would be calculated for d occurring given that a,b, and c have occurred.

Generally, if the conditional probabilities up to p(b a1,a2, ..., aN) are used, the ROM has N+1 parts and the probabilities p(b a1,a2, ..., aM) are calculated given a1 through aM are the first M letters of a word or the first M numbers of a sequence for M=1, 2, N−1. The probability p(b a1,a2, ..., aN) is the probability that b has occurred given that a1, a2, ..., aN has occurred. The number of input buffers would be N+1 and the number of input code words constituting an address to the ROM is N+1.

Message Expansion Decoder of Cross-Referenced Invention

Figure 4A:
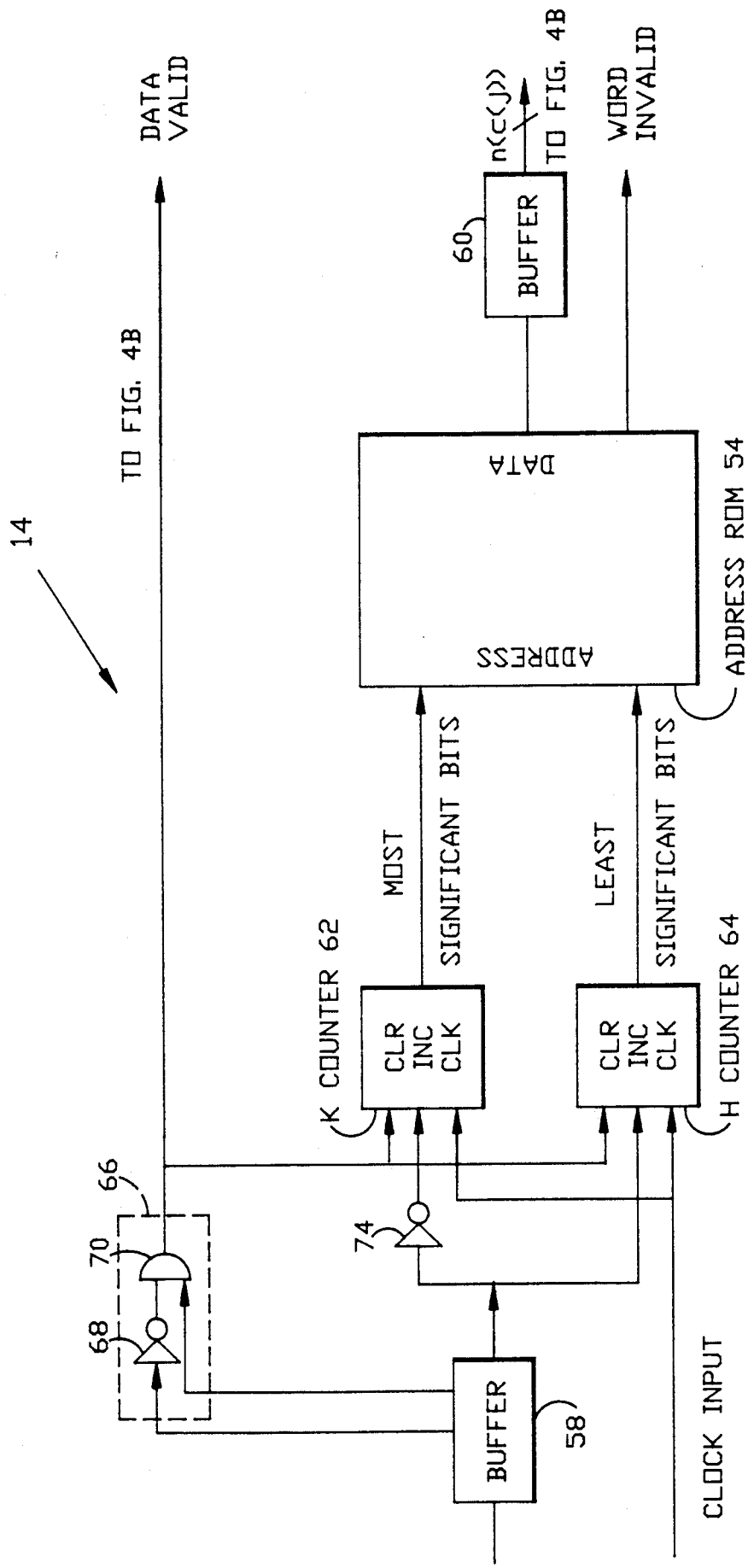
FIGS 4A and 4B taken together provide a detailed schematic diagram of the message expansion decoder of the cross-referenced invention.
Figure 4B:
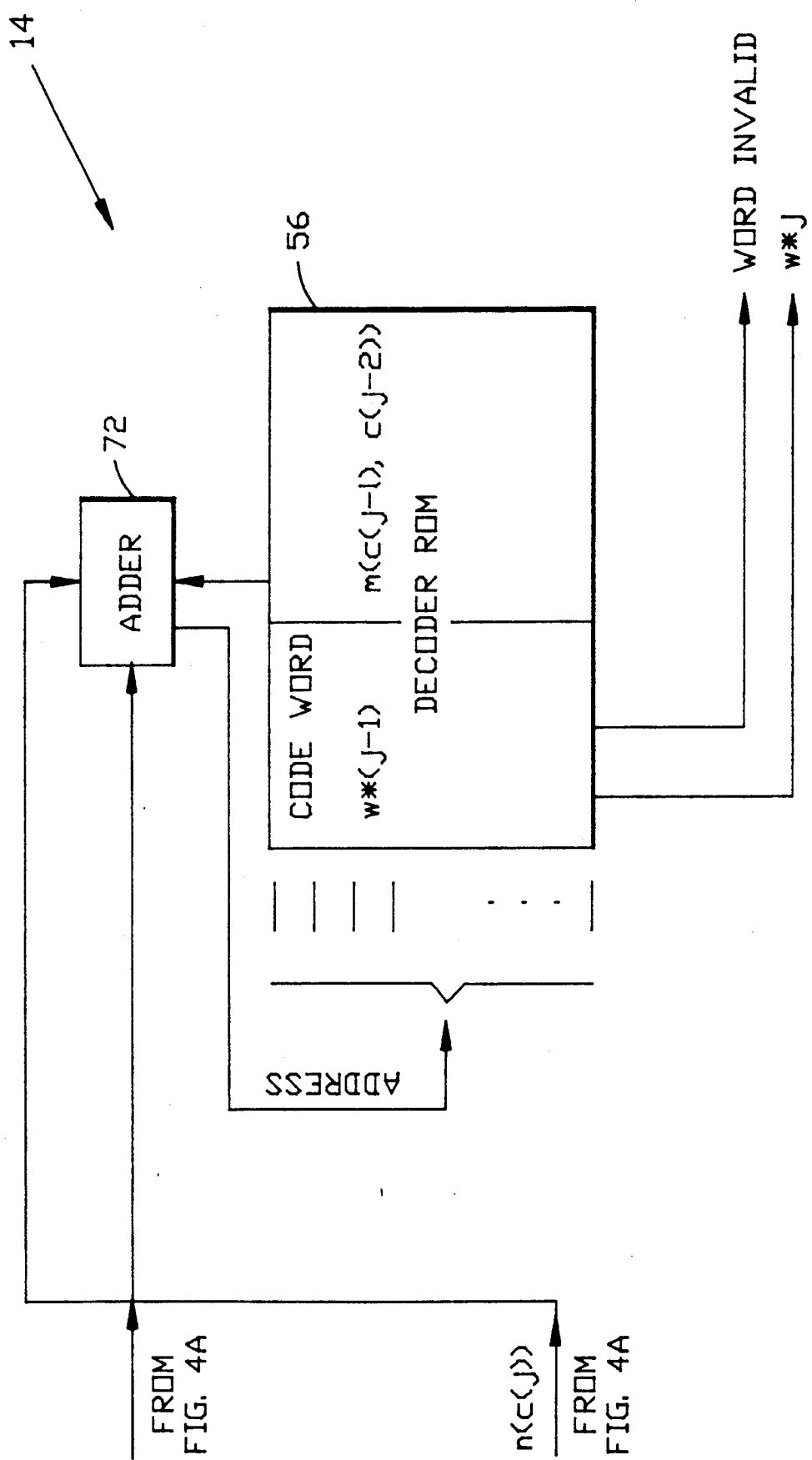

Referring to FIGS. 4A and 4B, the message expansion decoder 14 of the cross-referenced invention in the receiving portion 10B of the communication channel 10 is constructed of standard digital hardware and read-only memory designed to accept a sequence of encoder characters represented by concatenated variable-length code words (which are binary code words representing characters) and output a binary sequence of fixed-length code words representing the same characters. As described earlier, the input to decoder 14 received from demodulator 28 is bit stream w *1w *2 . . . w *(j−1)w *j . . . which consists of concatenated comma-free code words. Decoder 14 processes this input bit stream to successively identify the individual variable-length code words w *1, w *2, . . . w *(j−1), w *j . . . which encode characters c(1), c(2), . . . , c(j−1), c(j), . . . which are represented within the military communication network by the equal-length code words w*1, w*2, . . . , w*(j−1), w*j, . . . It is these equal-length code words that the decoder will recover and output.

Basically, decoder 14 of the cross-referenced invention is designed to reverse the processing steps of encoder 12 described above. Decoder 14 makes use of standard digital hardware components to accomplish this task. FIGS. 4A and 4B taken together are a detailed schematic diagram of an exemplary embodiment of actual digital components which comprise decoder 14 and implement the central processing accomplished by the decoder. In particular, decoder 14 includes address and decoder read-only memories (ROMs) 54 and 56, input storage buffer 58, address storage buffer 60, K and H counters 62 and 64, a detector 66 composed of inverter 68 and AND gate 70, and adder 72. These components can be similar to those identified earlier for use in encoder 12 and available from the same suppliers.

In order to reverse the processing steps of the encoder, it is necessary to first identify the individual comma-free code words in the string of bits. This is possible, albeit with some errors if bit errors have occurred because of noise and interference in channel 10, because of the comma-free property of the variable-length code words used by encoder 12. (If the time-varying broadcast signal is of much higher signal level than the interference and noise levels in communication channel 10, then bit errors will not occur in the demodulation process and j will equal i and w *k=s w k for k=1, 2, 3, . . . .)

Design of Address and Decoder ROMs of Decoder

A main function of decoder 14 is to efficiently calculate addresses to decoder ROM 56 used to decode the incoming variable-length comma-free code words. The first step in the calculation of the address is to calculate for each w *j an integer n(c(j)), which will be used in the calculation of an address to decode w *j. The integer n(c(j)) is written this way because its value does not depend on when the integer is calculated but only on the character associated with w*j. The integer n(c(j)) is calculated by operation of K and H counters 62 and 64 and address ROM 54 after recovery of the variable-length code words w *j by detector 66 from the encoded bit stream of concatenated variable-length comma-free code words.

The second step in the calculation of the address is to add n(c(j)) to an integer m(c(j−1),c(j−2)) to form an address of a storage location of decoder ROM 56. The integer n(c(j)) and the integer m(c(j−1),c(j−2)) are inputted to adder 72 respectively from address ROM 54 and decoder ROM 56. The integer m(c(j−1),c(j−2)) is inputted to adder 72 at the time decoder ROM 56 was addressed to decode the comma-free code word w *(j−1) representing the character c(j−1). Integer m(c(j−1),c(j−2)) is written as a function of both c(j−1) and c(j−2) because its value does not depend on when decoder ROM 56 is addressed but only upon the comma-free code word w *(j−1) representing c(j−1) being decoded at that time and upon the previous comma-free code word w *(j−2) representing c(j−2) decoded. Each storage location of decoder ROM 56 stores two things: (1) code word w*j to decode w *j and (2) integer m(c(j−1),c(j−2)) used in the calculation of the next address to decoder ROM 56.

Calculation of the integer n(c(j)) is accomplished through table look-up using address ROM 54. The table entries, n(c(j)), are calculated off-line with the calculations depending on the special form of the comma-free code words used in encoder 12 and decoder 14. The properties the fixed-length and variable-length code words must have in order for encoder 12 and decoder 14 to operate were discussed earlier in the "Properties of Code Words" section.

As described earlier in the aforementioned section, the comma-free code words are of the form: k "0"s followed by h "1"s with $0 < k <$ or $= P$ and $0 < h <$ or $= Q$. (Note, normally the available code words are described by the three inequalities: (1)$0 < k$, (2)$0 < h$, and (3) $k+h <$ or $= M$. The code set produced in this manner provides the most possible code words of each length.)

The data stored in address ROM 54 used for the table look-up of the integer n(c(j)) depend on the values of P and Q. As before, an exemplary application will be described herein suitable for encoding and decoding 56 characters—only the 56 information carrying characters of the military Baudot code need be encoded, the two shift characters of this code need not be encoded. Note that if P=7 and Q=8, then 56 comma-free code words are provided.

A one-to-one mapping of the pairs (k,h) to numbers n(k,h) from 1 through 56 can be constructed using the following formulas:

$$n(k,h) = 8(k - h) + h \quad \text{if } h < \text{or} = k; \text{ and}$$
$$n(k,h) = 56 + [8(k - h) + h] \quad \text{if } h > k.$$

Table I shows the numbers n(k,h) assigned to comma-free code words as defined by these formulas.

TABLE I

| | Number h of "1"s in Code Word | | | | | | | |
|---|---|---|---|---|---|---|---|---|
| | | 1 | 2 | 3 | 4 | 5 | 6 | 7 | 8 |
| Number k 3 of "0"s in Code Word 5 | 1 | 1 | 50 | 43 | 36 | 29 | 22 | 15 | 8 |
| | 2 | 9 | 2 | 51 | 44 | 37 | 30 | 23 | 16 |
| | 17 | 10 | 3 | 52 | 45 | 38 | 31 | 24 | |
| | 4 | 25 | 18 | 11 | 4 | 53 | 46 | 39 | 32 |
| | 33 | 26 | 19 | 12 | 5 | 54 | 47 | 40 | |
| | 6 | 41 | 34 | 27 | 20 | 13 | 6 | 55 | 48 |
| | 7 | 49 | 42 | 35 | 28 | 21 | 14 | 7 | 56 |

Integers n(c(j)), the unconditioned address summands, are calculated using the one-to-one mapping just described by letting n(c(j))=n(k(j),h(j)) with k(j) the number of "0"s and h(j) the number of "1"s in w *j and these lookup table values are permanently stored in ROM 40. The first step in the calculation of the decoder ROM address is now completed.

As mentioned above, the second step in the calculation of the decoder ROM address is to add integer n(c(j)) to integer m(c(j−1),c(j−2)) to form an address of the storage location of decoder ROM 56. The determination of integers m(c(j−1),c(j−2)) is central to the design of decoder 14 and depends on the part of the decoder ROM in which the integers are stored. The value assigned to the integer m(c(j−1),c(j−2)) depends on the character c(j) encoded by w *j, as well as the previous two characters c(j−1) and c(j−2) encoded by w *(j−1) and w *(j−2), but it does not depend on when these integers are decoded. In other words, the sequential (or time) index j is not important. To simplify the explanation, let:

"c" denote the character c(j) represented by the comma-free code word w *j in the process of being decoded, "d" denote the character c(j−1) represented by the comma-free code word w *(j−1), previously decoded, and "e" denote the character c(j−2) represented by the comma-free code word w *(j−2) decoded before w *(j−1). The characters c, d, and e are used to abstractly denote three successive characters, which may or may not be the same letter, number, or symbol.

The integers m(d,e) depend on the nature of the character c as well as the characters d and e. The characters were encoded depending on whether they were letters, numbers, or symbols. Using the same set notation as used in description of encoder ROM 40, these sets are denoted by:

$C[I] = \{A,B,C, \ldots, X,Y,Z\}$, the set of letters,
$C[II] = \{0,1,2, \ldots, 9\}$, the set of numbers, and
$C[III] = \{$punctuation symbols, special characters, control characters$\}$, the set of symbols.

The following rules governed the ways the characters were encoded:

(1) if c is in C[III], then c is unconditionally encoded;
(2) if c is in either C[I] or C[II], then c is conditionally encoded on the previous character,
  (a) if the previous character is in C[III], then c is encoded based on its probability of starting a word (if in C[I]) or of starting a sequence (if in C[II]),
  (b) if the previous character is not in C[III], then c is encoded conditioned on it and possibly on the character before it.

The design of decoder ROM 56 follows directly from the design of encoder ROM 40. The decoder ROM is viewed as composed of three parts. The first part of decoder ROM 56 decodes those variable-length code words which were assigned code words unconditioned on previous characters. The second part of decoder ROM 56 decodes those variable-length code words which were assigned code words conditioned on the previous character. The third part of decoder ROM 56 decodes those variable-length code words which were assigned code words conditioned on the previous two characters.

The address to decode w *j depends also on w *(j−1) and w *(j−2). This address is given by $$a(c(j),c(j-1),c(j-2)) = n(c(j)) + m(c(j-1),c(j-2))$$

which simplifies to using the notation introduced earlier to $$a(c,d,e) = n(c) + m(d,e).$$

The nature of the function m(d,e) is different in the first part of decoder ROM 56 than in the second and third parts thereof. In decoder ROM first part the value of m(d,e) only depends on the character d. In other words, m(d,e) has the same value for any character e. The definition of m(d,e) for the first part of decoder ROM 56 is completed by letting:
m(d,e) = 0 if the character d is a symbol (i.e. in C[III])
m(d,e) = (56)index(d) for d not in C[III], with index (d) defined by Table II.

TABLE II

| c | index (d) |
|---|---|
| a | 1 |
| b | 2 |
| . | . |
| . | . |
| z | 26 |
| 0 | 27 |
| 1 | 28 |
| . | . |
| 9 | 36 |

The integers m(d,e), which are stored in the second and third parts of decoder ROM 56, are defined as follows:

$m(d,e) = $ 0 if $d$ is in C[III]

$m(d,e) = $ 2016 + (56)[(36)(index($d$) − 1) + index($e$)]

if $d$ and $e$ are not in C[III].

It is unnecessary to define m(d,e) when e is in C[III] because in this case the previous address would not have been to the second or third parts of the decoder ROM. Note that, as defined here encoding of a character c not in C[III] always is conditioned on the previous two characters d and e provided neither of them are in C[III].

Recall that the general form of a decoder ROM address is: a(c,d,e) = n(c) + m(d,e), and that n(c) takes on integer values from 1 to 56. It follows that integers 1 through 56 address the first part of the decoder ROM, integers 57 through 2072 [56+(56)(36)] address the second part of the decoder ROM, and integers from 2073 to 56,504 address the third part of the decoder ROM. Thus, the rules for defining m(d,e) given above are correct.

Note that if wj representing c(j) was encoded by w j consisting of k(j) "0"s followed by h(j) "1"s not conditioned on a previously transmitted character c(j−1), then n(k(j),h(j)) addresses a storage location in the first part of the decoder ROM, which stores wj along with m(c(j),c(j−1)) as defined above. If wj representing c(j) was encoded by w j consisting of k(j) "0"s followed by h(j) "1"s conditioned on the previously transmitted character (c(j−1), then n(k(j),h(j))+index(c(3−1)) addresses a storage location in the second part of the decoder ROM, which stores wj along with m(c(j),c(j−1)) as defined above. If wj representing c(j) was encoded by w j consisting of k(j) "0"s followed by h(j) "1"s conditioned on the previously transmitted characters c(j−1) and c(j−2), then n(k(j),h(j))+2016+(56)[(36)(index(c(j−1)−1)+index(c(j−2)] addresses a storage location in the third part of the decoder ROM, which stores wj along with m(c(j),c(j−1)) as defined above.

If decoder 14 is designed as above it works for any sequence of encoded characters, provided adder 72 shown in FIG. 4B is zero when the decoder is started up. With adder 72 being zero at the start, then no storage locations can be addressed initially that are composed of integers which need to incorporate previously decoded characters d and e. Suppose that c(1) is the first character to be decoded. Then because adder 72 has contents zero, equivalent to setting m(c(0),c(−1)) equal to 0, the first address satisfies a(c(1),c(0),c(−1))=n(c(1)) so that w *1 is decoded using the first part of decoder ROM 56, as desired.

If c(1) is in C[III], then m(c(1),c(0))=0 as defined so that decoder 14 works in this case. If c(1) is not in C[III], then the next character c(2) is decoded conditioned on c(1). In this case m(c(1),c(0)) is determined by the character c(1) alone so that m(c(1),c(0)) is determined by its first coordinate c(0) as defined for the general case. So that w *2 is decoded correctly and the adder is correctly loaded with m(d,e) ready to decode w *3. From then on, the general case applies.

As designed, decoder ROM 56 functions as follows. The first part of the decoder ROM decodes w *j as w*j, when w*j represents c in C[III] and decodes w *j as w*j when encoding of c not in C[III] was conditioned on it being a first letter in a word or the first number in a sequence. The second part of the decoder ROM decodes w *j as w*j unconditionally, when w*j represents c in C[III] and w*j conditionally when the encoding of c not in C[III] was conditioned on d. The third part of the decoder ROM can only be addressed by summing n(c) with an integer m(d,e) stored in the first part or the second part of the decoder ROM. The third part of the decoder ROM decodes w *j as w*j unconditionally, when w*j represents c in C[III] and w*j conditionally when the encoding of c not in C[III] was conditioned on d and e.

FIGS. 4A and 4B show the hardware components of decoder 14 which are necessary to calculate the unconditional address summand and to determine both the conditional address summand and decode, respectively. There are two inputs to and two outputs from the portion of decoder 14 shown in FIG. 4A. The first input, designated CLOCK INPUT, is a clock signal derived from a suitable clock source (not shown) and used to control K and H counters 62 and 64. The second input is the code word sequence . . . w *j . . . seen in FIG. 2 which consists of concatenated comma-free code words and is inputted via input storage buffer 58 to counters 62 and 64 and detector 66. The first output is an unconditional summand n(c(j)) generated by address ROM 54 and outputted via address storage buffer 60 to provide one portion of the address for encoder ROM 56. The second output, designated DATA VALID, is a data valid "1" bit which is outputted by detector 66 each time an end of a code word is detected. This bit indicates that the summand n(c(j)) output from address ROM 54 is valid.

As mentioned earlier, message expansion decoder 14 is designed to reverse the processing steps of message compression encoder 12. In order to reverse the steps of the encoder, it is necessary to first identify and recover the individual variable-length comma-free code words in the concatenated stream of bits. The concatentated bit stream is received serially by input storage buffer 58 and outputted serially to parallel K and H counters 62 and 64. Inverter 74 connected between buffer 58 and K counter 62 ensures that the K counter counts only "0'S (after inverted to be a "1" by inverter 74), while H counter 64 counts "1"s. The counters thus operate in such manner that the number "k" of "0"s and the number "h" of "1"s in the code words are both obtained. The counters are cleared at the end of each code word, i.e. when a sequence of "1"s changes to a sequence of "0"s.

For detecting the end of each code word, the input bit stream is also received from buffer 58 by inverter 68 and AND gate 70 of detector 66. Detector 66 of decoder 14 operates the same as detector 48 of encoder 12. The output of AND gate 70 remains "0" until the previous bit of the bit series is a "1" and the next bit is a "0" (inverted to be a "1" by inverter 68). This occurs at the end of a code word. Thus, the output of AND gate 70 becomes a "1" when the end of a code word is detected.

When a code word ends, the counter values k(j) and h(j) create a unique address inputted to address ROM 54. The data stored at the location identified by the unique address consists of the integer n(c(j))=n(k(j),h(j)) which is assigned to the code word just ended, as defined by Table I. If the counter values do not correspond to a code word corresponding to some encoded character, then address ROM 54 sends out a "1", designated as WORD INVALID in FIG. 4A; otherwise this output is "0". (By design k is <or=7 and h is <or=8, so if either of these conditions is not met a bit error has occurred. Note most errors will lead to incorrect k and h values still in the allowable range, so that only some errors are detected.)

There are two inputs to and two outputs from the portion of decoder 14 shown in FIG. 4B also. The first input is an unconditional summand n(c(j)) to adder 72 from address ROM 54 via address storage buffer 60. The second input, designated DATA VALID, is the data valid "1" bit from detector 66 to adder 72 used to cause an addition operation to occur at adder 72. The first output, constituting the primary output of decoder 14, is the sequence of fixed-length decoded words w*j, . . . , w*2, w*1 from decoder ROM 56. The second output, designated WORD INVALID, is an indication when the decoder ROM output is invalid.

The generation of an address of a storage location of decoder ROM 56 occurs at adder 72. The decoder ROM address is calculated at adder 72 by summing integer n(c(j)), which equals n(k(j),h(j)) and is associated with incoming code word w *j, with m(c(j−1),c(j−2)) the integer stored in the last storage location of decoder ROM 56 that was addressed. When the decoder ROM is addressed, the code word w *j is decoded and the integer m(c(j),c(j−1)) is routed to adder 72 ready for use in the calculation of the decoder ROM address for decoding the next incoming code word w *(j+1).

The design of address and decoder ROMs 54 and 56 has been described above for an alphabet or character set size of 56 characters and a particular conditional probability encoding procedure which led to the use of particular comma-free code words. As was true with ROM 40 of encoder 12, address and encoder ROMs 54 and 56 of decoder 14 can be designed for other character sets as well, for instance one composed of words and numbers rather than just letters and numbers, and with characters of the sets conditioned in different ways than described above.

By way of example, the following computer program written in Pascal computer language can be used off line as described above to calculate the frequencies of occurrences of characters conditioned on one or more characters needed to determine the entries to be burned into the ROM of the disclosed encoder and decoder. The program operates on a sample file of text and calculates the character conditional probability function. The values of this function are then written to an output file. The names of these files are input by the user. As an example, P['A','B','E'] is the number of times the character sequence 'ABE' appears in the input text. The character '@' is used to represent all non-alphabetical characters. This program gives conditional probabilities based on the two previous characters. If conditional probabilities are desired for the previous three characters, another dimension may be added to the p array. If conditional probabilities are desired based on only the previous character a dimension may be deleted from the p array.

```
var
    p : array['@' ... 'Z','@' ... 'Z','@' ... 'Z'] of integer;
    {conditional probability distribution function}
    infile, outfile : text;
    {input and output files}
    c1,c2,c3 : char;
    {the three most recent characters}
    s : string;
    {user response variable}
    count : real;
    {the total number of characters in the input file}
begin
    {initialize the probabilities to 0}
    for c1 := '@' to 'Z' do
        for c2 := '@' to 'Z' do
            for c3 := '@' to 'Z' do
                p[c1,c2,c3] := 0;
    {setup the input file}
    writeln('Please type the name of the input file.');
    readln(s);
    assign(infile,s);
    reset(infile);
    {setup the output file}
    writeln('Please type the name of the output file.');
    readln(s);
    assign(outfile,s);
    rewrite(outfile);
    c1 := '@';
    c2 := '@';
    repeat
        read(infile,c3);           {get the next character}
        write(c3);
        c3 := upcase(c3);          {upper case only}
        if not (c3 in ['A' ... 'Z']) then c3 := '@';
                                   {check to see if it's alphabetical}
        p[c1,c2,c3] := p[c1,c2,c3] + 1;  {increment the proper count}
        count := count + 1;              {increment the character counter}
        c1 := c2;                        {ripple the characters down ... }
        c2 := c3;                        { ... the line}
    until eof(infile);                   {are we done yet?}
    {write the output}
    writeln(outfile,'C1 C2 C3 COUNT[C1,C2,C3] P[C1,C2,C3]');
    for c1 := '@' to 'Z' do
        for c2 := '@' to 'Z' do
            for c3 := '@' to 'Z' do
                writeln(outfile,c1:2,c2:4,c3:4,p[c1,c2,c3]:12,
                        p[c1,c2,c3]/count:21:8);
    {close the files}
    close(infile);
    close(outfile);
    {all done}
end.
```

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Having thus described the invention, what is claimed is:

1. A message compression encoder for use in a communication channel carrying messages constructed of characters from a predetermined character set, said encoder comprising:
   (a) a memory having a plurality of storage locations storing comma-free code words representing characters of said predetermined set in accordance with predetermined probabilities of occurrence in messages carried by said communication channel;
   (b) first means coupled with said memory for receiving fixed-length code words representing characters of messages carried by said communication channel and arranging said received fixed-length code words to generate addresses of said storage locations for addressing said memory;
   (c) said memory being operable in response to addressing of said storage locations to output stored fixed-length comma-free code words which contain variable-length code words therein representing the same characters represented by said fixed-length code words but being composed of fewer bits than compose said fixed length code words; and (d) second means coupled with said memory for receiving said fixed-length comma-free code words from said memory and for separating therefrom and outputting said variable-length code words and thereby transforming said fixed-length code words carried by said communication channel to variable-length code words having fewer bits.

2. The encoder of claim 1 wherein said memory is a read-only memory.

3. The encoder of claim 1 wherein said first means is a temporary storage buffer.

4. The encoder of claim 3 wherein said temporary storage buffer is a serial-in and parallel-out temporary storage buffer.

5. The encoder of claim 1 wherein said second means includes a parallel-in and serial-out temporary storage buffer.

6. The encoder of claim 1 wherein said second means includes:
 a temporary storage buffer for receiving said fixed-length comma-free code words from said memory and outputting said fixed-length comma-free code words; and
 a detector coupled with said temporary storage buffer for receiving said fixed-length comma-free code words from said temporary storage buffer and detecting the end of said variable-length code words contained therein for separating therefrom and outputting said variable-length code words.

7. The encoder of claim 1 wherein said memory includes:
 said storage locations in a first part storing comma-free code words which represent characters having probabilities of occurrence not conditioned on the previous occurrence of a particular character; and
 said storage locations in a second part storing comma-free code words which represent characters having probabilities of occurrence conditioned on the previous occurrence of a particular character.

8. The encoder of claim 1 wherein:
 said first means is operable to reset itself to an initial condition so as to remove previously received fixed-length code words therefrom in response to receipt of a predetermined code word; and
 said memory is coupled with said first means and stores said predetermined code word at one of said storage locations in said memory, said memory being operable to output said predetermined code word upon said storage location storing said predetermined code word being addressed by said first means.

9. The encoder of claim 8 wherein said predetermined code word represents a blank character of said predetermined set.

10. A message compression encoder for use in a communication channel carrying messages constructed of characters from a predetermined character set, said encoder comprising:
 (a) a read-only memory having a plurality of storage locations storing comma-free code words representing characters of said predetermined set in accordance with predetermined probabilities of occurrence in messages carried by said communication channel;

(b) an input temporary storage buffer coupled with said read-only memory for receiving fixed-length code words representing characters of messages carried by said communication channel and arranging said received fixed-length code words to generate addresses of said storage locations for addressing said read-only memory;
 (c) said read-only memory being operable in response to addressing of said storage locations of said read-only memory to output stored fixed-length comma-free code words which contain variable-length code words therein representing the same characters represented by said fixed-length code words but being composed of fewer bits than compose said fixed-length code words;
 (d) an output temporary storage buffer coupled with said read-only memory for receiving said fixed-length comma-free code words from said read-only memory and outputting said fixed-length comma-free code words; and
 (e) a detector coupled with said output temporary storage buffer for receiving said fixed-length comma-free code words therefrom and detecting the end of said variable-length code words contained therein for separating said variable-length code words therefrom and outputting said variable-length code words in concatenated form so as to thereby transform said fixed-length code words carried by said communication channel to variable-length code words having fewer bits and concatenated together.

11. The encoder of claim 10 wherein said input temporary storage buffer is a serial-in and parallel-out temporary storage buffer.

12. The encoder of claim 10 wherein said output temporary storage buffer is a parallel-in and serial-out temporary storage buffer.

13. The encoder of claim 10 wherein said read-only memory includes:
 said storage locations in a first part storing comma-free code words which represent characters having probabilities of occurrence not conditioned on the previous occurrence of a particular character; and
 said storage locations in a second part storing comma-free code words which represent characters having probabilities of occurrence conditioned on the previous occurrence of a particular character.

14. The encoder of claim 10 wherein:
 said input temporary storage buffer is operable to reset itself to an initial condition so as to remove previously received fixed-length code words therefrom in response to receipt of a predetermined code word; and
 said read-only memory is coupled with said input temporary storage buffer and stores said predetermined code word at one of said storage locations of said read-only memory, said read-only memory being operable to output said predetermined code word upon said storage location storing said predetermined code word being addressed by said input temporary storage buffer.

15. The encoder of claim 14 wherein said predetermined code word represents a blank character of said predetermined set.

16. A message compression encoding method for use in a communication channel carrying messages constructed of characters from a predetermined character set, said encoding method comprising the steps of:

(a) storing fixed-length comma-free code words representing characters of said predetermined set in a plurality of storage locations of a memory in accordance with predetermined probabilities of occurrence in messages carried by said communication channel;

(b) receiving in an input temporary storage buffer fixed-length code words representing characters of messages carried by said communication channel and arranging said fixed-length code words therein to generate addresses of said storage locations for addressing said memory;

(c) in response to addressing said storage locations of memory, outputting stored fixed-length comma-free code words from said memory which contain variable-length code words representing the same characters as represented by said fixed-length code words but being composed of fewer bits than compose said fixed-length code words; and (d) receiving in an output temporary storage buffer said fixed-length comma-free code words from said storage locations of said memory and separating said variable-length code words therefrom and outputting said variable-length code words in concatenated from so as to thereby transform said fixed-length code words carried by said communication channel to variable-length code words having fewer bits and concatenated together.

17. The method of claim 16 further comprising:
resetting said input temporary storage buffer to an initial condition so as to remove previously received fixed-length code words therefrom in response to receipt of a predetermined code word outputted from one of said storage locations of said memory upon said storage location storing said predetermined code word being addressed by said input temporary storage buffer.

18. The method of claim 17 wherein said predetermined code word represents a blank character of said predetermined set.

19. The method of claim 16 wherein said storing includes storing said fixed-length comma-free code words representing characters of said predetermined set in a plurality of storage locations of a read-only memory.

20. The method of claim 16 wherein said separating of said variable-length code words from said fixed-length comma-free code words includes detecting the end of said variable-length code words contained therein.

21. The method of claim 16 wherein said storing includes:
storing in storage locations in a first part of said memory comma-free code words which represent characters having probabilities of occurrence not conditioned on the previous occurrence of a particular character; and
storing in storage locations in a second part of said memory comma-free code words which represent characters having probabilities of occurrence conditioned on the previous occurrence of a particular character.

* * * * *